United States Patent [19]

Piole

[11] Patent Number: 4,847,491

[45] Date of Patent: Jul. 11, 1989

[54] RESONANT LOOP CURRENT DISTURBING PROBE

[75] Inventor: Philippe Piole, Paris, France

[73] Assignees: Etablissement Public de Diffusion dit: Telediffusion de France, Paris; Etat Francais represente par le Ministre des PTT, Centre National d'Etudes des Telecommunications, Issy Les Moulineuax, both of France

[21] Appl. No.: 58,285

[22] Filed: Jun. 4, 1987

[30] Foreign Application Priority Data

Jun. 10, 1986 [FR] France .................. 86 08363

[51] Int. Cl.$^4$ ............................................. G01D 5/34
[52] U.S. Cl. .............................. 250/231 R; 250/227; 343/748; 324/96
[58] Field of Search .............. 250/231 R, 227; 324/77 K, 96; 343/741, 744, 748

[56] References Cited

U.S. PATENT DOCUMENTS 1,781,363  10/1930  Bruce .
3,902,177  8/1975   Mori et al. ................ 343/741
4,518,965  5/1985   Hikada ...................... 343/744

OTHER PUBLICATIONS

"Photoconductive Probe for Measuring Electromagnetic Fields", p. 1748.
French Search Report Primary Examiner—Edward P. Westin
Assistant Examiner—Khaled Shami
Attorney, Agent, or Firm—Nixon & Vanderhye

[57] ABSTRACT

A resonant loop current disturbing probe. This probe comprises a conductive loop closed on a photoresistor, a light-emitting diode optically coupled to the photoresistor by an optical fiber and a diode control circuit. This probe is characterized in that it also comprises a variable capacitor connected in parallel to the loop. The loop-capacitor assembly forms a resonant circuit, the capacitor being adjusted in such a way that said circuit resonates at the frequency of the current to be disturbed. Application is to the measurement of the current in antennas.

10 Claims, 2 Drawing Sheets

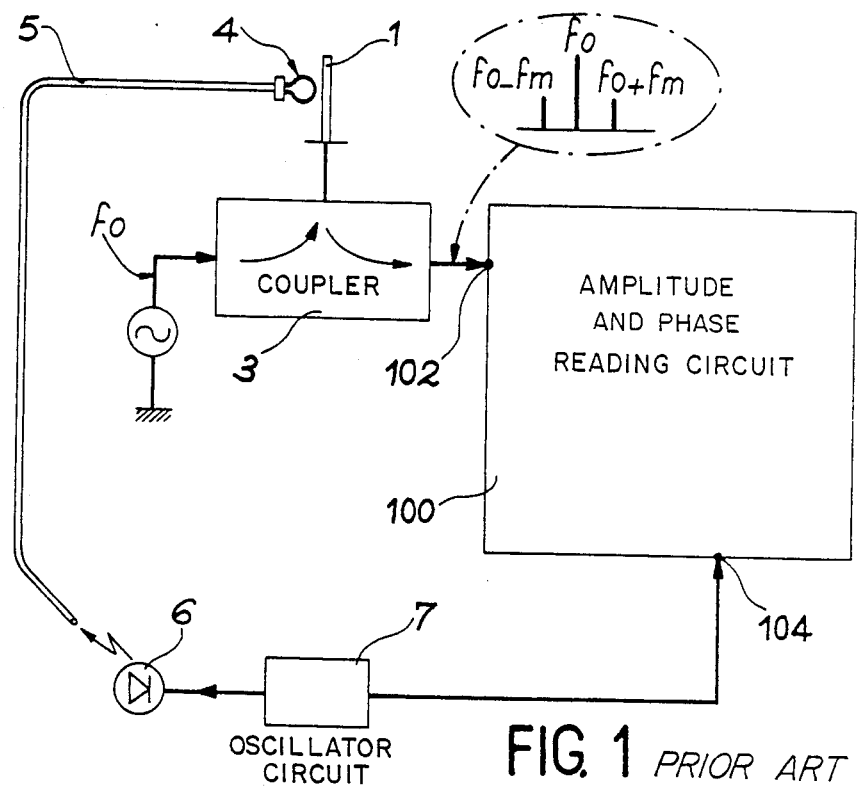
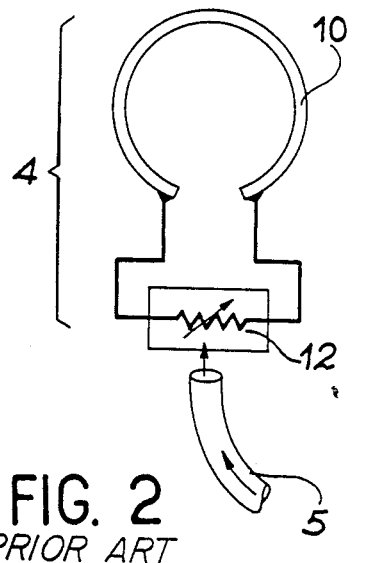
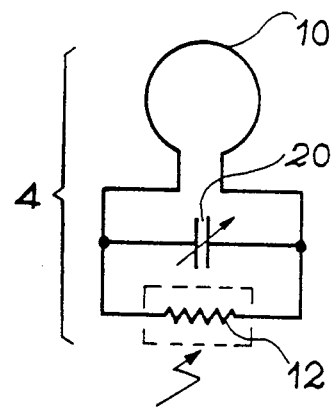
FIG. 1 PRIOR ART
FIG. 2 PRIOR ART
FIG. 3

RESONANT LOOP CURRENT DISTURBING PROBE

BACKGROUND OF THE INVENTION

The present invention relates generally to a resonant loop current disturbing probe and more particularly to the measurement of the distribution of the current along an antenna, particularly in the so-called modulated return radiation method.

The modulated return method is shown in FIG. 1.

An antenna 1 is supplied by a generator 2 across a circulator 3 (or hybrid T or coupler). The operating frequency is fo. A small probe 4, formed from one or more conductive turns closed on a photoresistor is moved along the antenna. The probe photoresistor is illuminated by light radiation guided by an optical fibre 5 supplied by a light-emitting diode 6. The latter is controlled by a circuit 7 comprising an oscillator at a frequency fm. The light radiation amplitude-modulated in this way at frequency fm leads to a variation in the resistance of the photoresistor inserted in the probe. The probe is couple to the magnetic field produced by the current flowing in the antenna, so that the electric signal reflected by the antenna is amplitude-modulated at frequency fm. Thus, the spectrum of the reflected signal is formed by a carrier at frequency fo and by two side bands at frequencies fo-fm and fo+fm. Such a signal carries amplitude and phase informations relative to the current flowing in the antenna to the right of the probe. A circuit 100 makes it possible to read these informations.

For example, such a method is described in the article by K. Itzuka entitled "Photoconductive Probe For Measuring Electromagnetic Fields" published in Proceedings of the IEE, vol 110, No. 10, October 1963.

The attached FIG. 2 shows in greater detail the structure of probe 4, where it is possible to see a loop 10, a photoresistor 12 and the optical fibre 5 referred to hereinbefore. Although being satisfactory in certain respects, such a probe lacks sensitivity.

SUMMARY OF THE INVENTION

The object of the present invention is to obviate this disadvantage, which is brought about by making the probe resonant. For this purpose, a variable capacitor is connected to the loop and adjusted to a value such that the loop - capacitor assembly forms a resonant circuit for the frequency of the current flowing in the antenna, i.e. in the example of FIG. 1 for frequency fo. This gives a better sensitivity, as will be shown hereinafter. The dimensions of the probe can then be reduced.

The invention also relates to a further improvement, which is combined with the first and which consists of shielding the probe.

Finally, another improvement makes it possible to further increase the sensitivity of the probe and consists of exciting the light-emitting diode by a pulse signal, whose cyclic ratio is varied by giving it a value differing from ½ (which corresponds to the square signal), instead of by a square signal. the performance characteristics of the photo resistor are consequently improved.

BRIEF DESCRIPTION OF THE DRAWINGS

The invention is described in greater detail hereinafter relative to non-limitative embodiments and the attached drawings, wherein show:

FIG. 1, already described, illustrates the modulated return radiation method.

FIG. 2, already described, shows a prior art aperiodic probe.

FIG. 3, the equivalent electric diagram of the probe according to the invention.

DETAILED DESCRIPTION OF THE PREFERRED EMBODIMENTS

The electric diagram of FIG. 3 shows a loop 10 closed or shorted by a photoresistor 12 and a variable capacitor 20. The loop-capacitor assembly forms a resonant circuit LC, which is adjusted so as to be resonant at the operating frequency fo.

Figure 4:
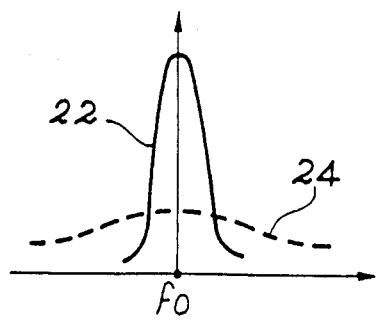
FIG. 4, the overvoltage variation of the probe according to the invention as a function of the frequency.

FIG. 4 shows the voltage variation of said circuit as a function of the frequency. This voltage passes through a maximum for the resonant frequency fo and decreases on either side of this value. When no light strikes the photoresistor, the latter has a high resistance and the circuit is placed under and voltage, curve 22 being obtained. However, when the photoresistor is illuminated, its resistance drops and the voltage drops, so that curve 24 is obtained. Thus, at fixed frequency, the modulation of the illumination of the photoresistor leads to a considerable voltage variation and consequently to a modulation of the magnetic disturbance caused by the probe. When the probe is aperiodic, as in the prior art, its influence on the antenna varies much less when the illumination of the photoresistor changes. Thus, sensitivity is significantly improved by making the probe resonant.

Figure 5A:
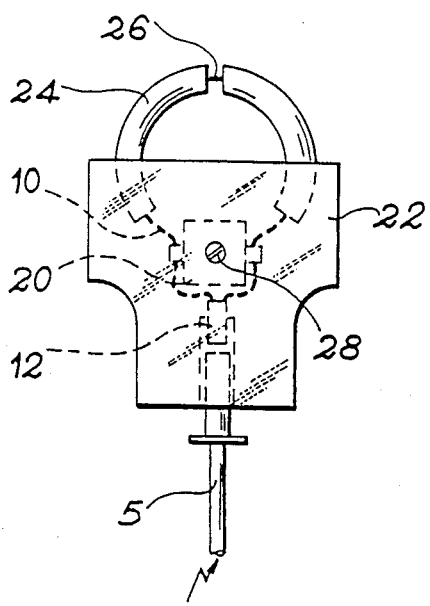
FIG. 5a and 5b, the constitution of the probe.
Figure 5B:
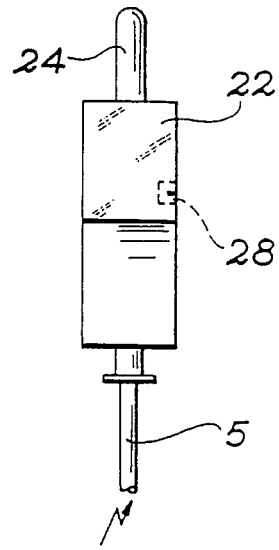

An embodiment of the probe is shown from the front in FIG. 5a and in profile form in FIG. 5b. It is once again possible to see loop 10, photoresistor 12, optical fibre 5 and variable capacitor 20. There is also a shield 22 surrounding the capacitor and the lower half of the loop. The latter is also shielded on its other half by a sheath 24, which is perforated by a slot 26 enabling the magnetic field to enter the loop. Capacitor 20 is accessible from the outside due to a hole 28 made in the shield.

In order to operate in the range 150 to 250 MHz, the loop e.g. has a diameter of 15 mm, i.e. approximately X/100.

Figure 6:
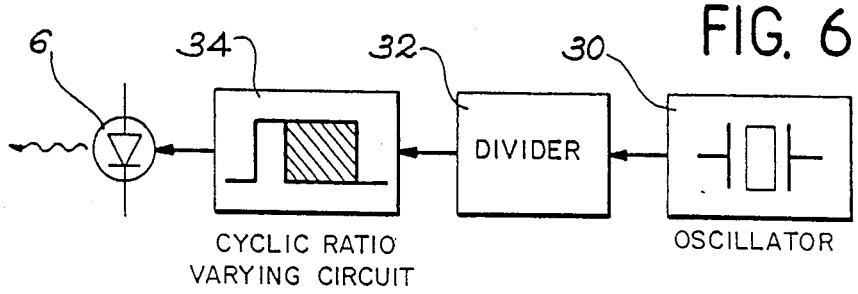
FIG. 6, a light-emitting diode control means.

In order to excite the light-emitting diode, it is possible to advantageously use a circuit, like that of FIG. 6. A quartz oscillator 30 e.g. functions at 2 MHz. It is followed by a divider 32, e.g. by 4096, which makes it possible to obtain a pulse train with a repetition rate equal to approximately 488 Hz. A circuit 34 makes it possible to vary the cyclic ratio of this signal and optimize the response of the photoresistor. Thus, the response of the latter decreases when the modulation frequency increases, due to the migration time of the carriers in the photoconductor. By limiting the illumination time, saturation of the photoconductor is prevented, so that sensitivity is further improved by said control means.

What is claimed is:

1. A current disturbing device for the measurement of a current distributor, said current having a frequency fo, said device comprising:
    a probe comprising at least one conductive open loop electromagnetically energized only by said current distributor, a photoresistor connected to said loop to short the same, a variable capacitor connected in parallel with said photoresistor, said loop, photoresistor and capacitor comprising a resonant circuit having a resonant frequency of fo;

an optical fiber having an input and output, said output being optically coupled to said photoresistor;

a light-emitting diode, optically coupled to said input of said optical fiber; and a control circuit for controlling said light emitting diode.

2. A probe according to claim 1, wherein it comprises a shield around the loop and the capacitor with a small width opening around the loop.

3. A probe according to claim 1, wherein the control circuit of the light-emitting diode supplies the latter with a pulse signal with a variable cyclic ratio.

4. An improvement in a loop current disturbing probe for measurement of current distribution along an antenna operating at a frequency fo, said probe comprising a conductive loop electromagnetically energized only by said antenna shorted by a photoresistor and said improvement comprising a capacitor means, connected in parallel with said photoresistor, for forming, with said loop, an LC resonant circuit at said frequency fo.

5. A current disturbing probe for measurement of current distribution along an antenna operating at a frequency fo, said probe comprising:

a conductive loop electromagnetically energized only by said antenna;

photoresistor means for shorting said conductive loop;

capacitive means, for forming, with said conductive loop an LC resonant circuit;

an optical fiber having an input and output, said output optically coupled with said photoresistor;

light-emitting diode means optically coupled to said input of said optical fiber;

oscillator circuit means electrically connected to said light-emitting diode, for stimulating light emissiom therefrom at a frequency fm, where fm is different from said frequency fo; and means responsive to said antenna for providing current distribution information based upon amplitude and phase information received from the antenna and based upon frequency $f_m$ received from said control circuit.

6. A probe according to claim 5, wherein said capacitor means comprises a variable capacitor.

7. A probe according to claim 5, wherein said L resonant circuit is resonant at said frequency fo.

8. A probe according to claim 5, further including means for electromagnetically shielding said capacitor means and a majority of said conductive loop;

means defining a slot in said shielding means enabling radiation from said antenna to enter said conductive loop.

9. A probe according to claim 5, wherein said oscillator circuit means comprises a means for providing a repetition pulse rate signal; and means for varying the cyclic ratio of said signal from said oscillator means and for applying said cyclic ratio varied signal to said diode.

10. A probe according to claim 8, wherein said oscillator circuit means comprises a means for providing a repetition pulse rate signal; and means for varying the cyclic ratio of said signal from said oscillator means and for applying said cyclic ratio varied signal to said diode.

* * * * *